(12) United States Patent
Lakhani et al.

(10) Patent No.: US 7,539,896 B2
(45) Date of Patent: *May 26, 2009

(54) REPAIRABLE BLOCK REDUNDANCY SCHEME

(75) Inventors: Vinod Lakhani, Palo Alto, CA (US); Benjamin Louie, Fremont, CA (US)

(73) Assignee: Micron Technology, Inc., Boise, ID (US)

(*) Notice: Subject to any disclaimer, the term of this patent is extended or adjusted under 35 U.S.C. 154(b) by 70 days.

This patent is subject to a terminal disclaimer.

(21) Appl. No.: 11/604,744

(22) Filed: Nov. 28, 2006

(65) Prior Publication Data

US 2007/0074070 A1    Mar. 29, 2007

Related U.S. Application Data

(63) Continuation of application No. 10/184,961, filed on Jul. 1, 2002, now Pat. No. 7,159,141.

(51) Int. Cl.
*G06F 11/00* (2006.01)

(52) U.S. Cl. .......................................... 714/8; 714/710

(58) Field of Classification Search .................... 714/8, 714/710
See application file for complete search history.

(56) References Cited

U.S. PATENT DOCUMENTS

| 5,325,334 A | 6/1994 | Roh et al. |
| 5,355,339 A | 10/1994 | Oh et al. |
| 5,469,390 A | 11/1995 | Sasaki et al. |
| 5,758,056 A | 5/1998 | Barr |
| 6,035,432 A * | 3/2000 | Jeddeloh .................... 714/763 |
| 6,195,762 B1 * | 2/2001 | Shore ........................... 714/8 |
| 6,205,515 B1 | 3/2001 | Huang |
| 6,240,525 B1 | 5/2001 | Chiang |
| 2004/0003315 A1 | 1/2004 | Lakhani et al. |

* cited by examiner

*Primary Examiner*—Bryce P Bonzo
(74) *Attorney, Agent, or Firm*—Dickstein Shapiro LLP

(57) ABSTRACT

A scheme for block substitution within a flash memory device is disclosed which uses a programmable look-up table to store new addresses for block selection when certain input block addresses are received. The new addresses are loaded into a programmable fuse latch each time an address transition is detected in the input address. The new addresses may contain block addresses or block and bank addresses.

34 Claims, 10 Drawing Sheets

REPAIRABLE BLOCK REDUNDANCY SCHEME

CROSS REFERENCE TO RELATED APPLICATIONS

The present application is a continuation of U.S. patent application Ser. No. 10/184,961, filed on Jul. 1, 2002, now U.S. Pat. No. 7,159,141 the disclosure of which is incorporated by reference in its entirety.

FIELD OF THE INVENTION

The invention relates to a method and apparatus for achieving block redundancy in a non-volatile memory.

BACKGROUND OF THE INVENTION

During the testing of a fabricated memory device, it is often discovered that certain portions of a memory array are faulty, unreliable or defective in some way. A typical way to correct this problem is to flag the region as defective by blowing fuses or anti-fuses which set hardwired latches associated with the defective region and which map the defective region to a non-defective fully-operable redundant region. With this re-mapping, all attempts to access the defective region will be redirected to the redundant region known to be properly working.

Many memory systems implement this re-routing on a column-by-column or row-by-row basis. However, non-volatile memory like flash memory lends itself well to a block redundancy approach where redundant blocks of memory cells are substituted for defective main memory blocks. Fuses or anti-fuses are associated with the redundant memory blocks and are programmed with the addresses of the defective blocks. The fuse or anti-fuse programming sets corresponding latches which are used to redirect accesses from a defective memory block to a redundant memory block.

Fuses or anti-fuses and their associated latches and program circuitry take up a considerable area of a memory die and, once programmed to specific addresses cannot later be reprogrammed. As a result, there is a limited number of defective main memory blocks which can be identified for mapping to redundant memory blocks. In order to add more defective address possibilities, additional fuse and/or anti-fuse sets and associated latches are required which increases die area.

BRIEF SUMMARY OF THE INVENTION

In one aspect the invention provides a method and apparatus for achieving reduced complexity of redundant memory block addressing while allowing more memory block addresses to be used than there are fuse sets for loading and latching those addresses. In the invention, latches are used to store addresses of defective memory blocks, but the latches can be reprogrammed from a look-up table which holds a plurality of addresses which can be used for redundant block substitution. Many more redundant addresses are available in the look-up table than is capable of being held by the latches. An address decoder is used to select available programmed addresses from the look-up table which can be loaded into the latches for redundant block substitution whenever certain address transitions are detected.

The look-up table can be programmed to substitute a redundant memory block for a defective main memory block, a redundant memory block for another redundant memory block, a main memory block for another main memory block, or a main memory block for a redundant block.

These and other aspects feature an advantage of the invention would be more clearly understood from the following detailed description of the invention which is provided in connection with the accompanying drawings.

DETAILED DESCRIPTION OF THE INVENTION

The present invention can generally be used to substitute one memory block for another memory block and particularly may be used for substituting a non-defective memory block for a defective memory block within a memory system. It is particularly useful in non-volatile memory systems such as flash memory.

Figure 1:
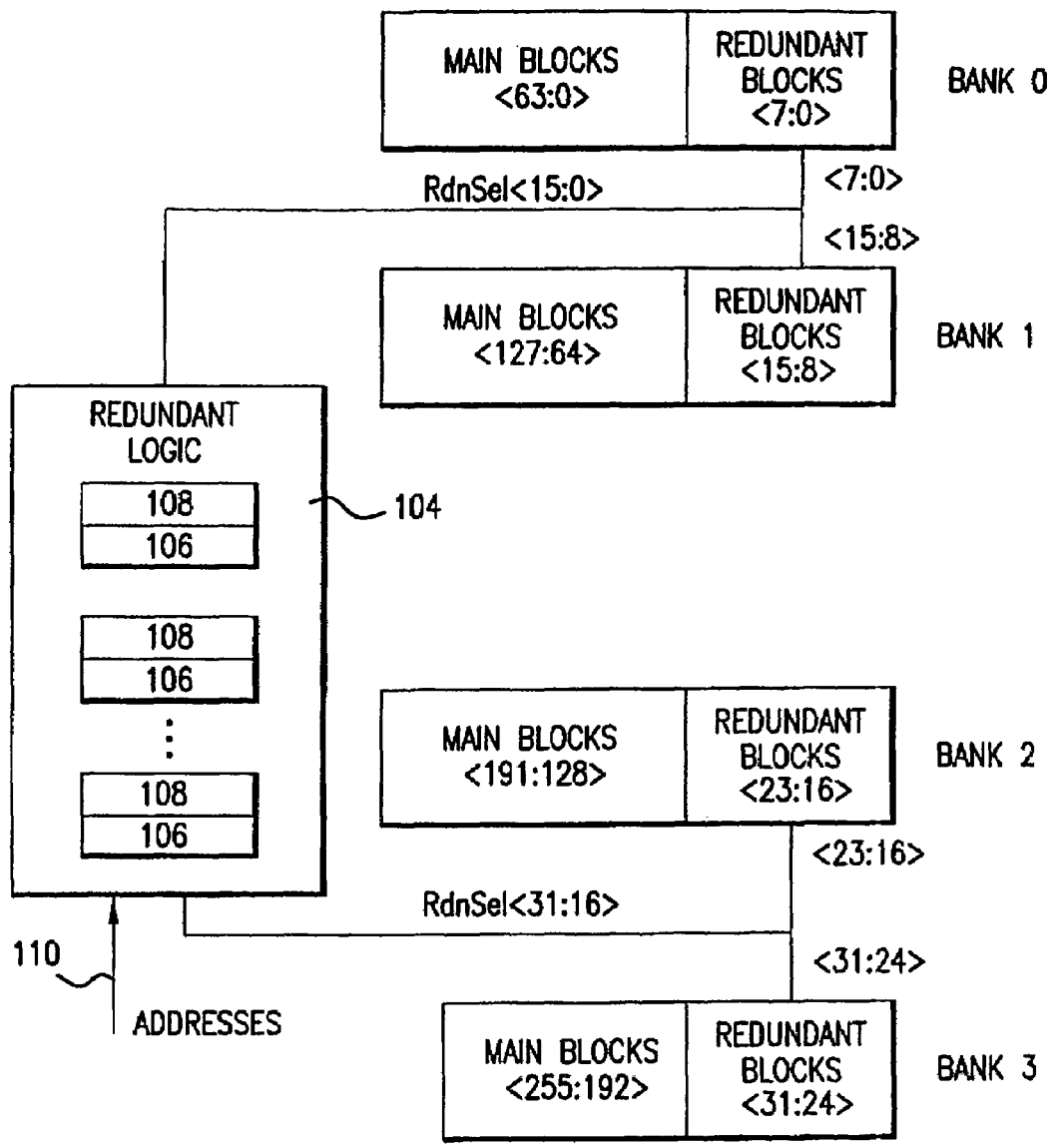
FIG. 1 is a block diagram showing a prior art relationship between memory banks of a flash memory, including primary and redundant memory blocks associated with each memory bank.

As shown in FIG. 1, it is known to divide a memory device such as flash memory into memory banks and to further divide the memory banks into memory blocks. FIG. 1 shows memory banks 0-3 each having 64 main memory blocks and 8 redundant memory blocks contained therein. Thus, bank 0 contains main memory blocks addressable as <63:0> and redundant memory blocks addressable as <7:0>, while memory banks 1-3 respectively contain memory blocks <127:64>, redundant blocks <15:8>, main blocks <191:128>, redundant blocks <23:16>, and main blocks <255:192>, and redundant blocks <31:24> respectively. In FIG. 1 all of the main memory blocks and redundant blocks are of the same size. It should be noted that the size of the memory array in terms of the number of main and redundant blocks is merely exemplary. Many different memory arrays having more or less numbers of main blocks and redundant blocks may be employed with more or fewer than the four memory banks illustrated.

When a defective main block is found in one of the memory banks during a memory test, its address is loaded into fuse sets 108 in the redundant logic circuit 104. These fuse sets are configured as programmable fuses (or anti-fuses) which are connected to latches 106. Thus, an address is hardwired by blowing the fuses or fuse sets 108 for setting the latch contents. The latch contents are used in an address comparator. Thus, when an incoming address 110 matches a programmed address set in the fuse sets 108 and held in the latches 106, the address comparator causes redundant logic 104 to select one of the redundant blocks in a given bank as a substitute for the defective main block in the same bank.

A limitation of the FIG. 1 arrangement is that once the programmable fuses (or anti-fuses) of a fuse set 108 are set there is a permanent relationship established between an address of a defective main block set in the fuses and a substituted redundant memory block within the same bank. In addition, the number of defective addresses which can be programmed into the fuses of the fuse sets 108 is limited by the number of available fuse sets 108 and associated latches 106.

Figure 2:
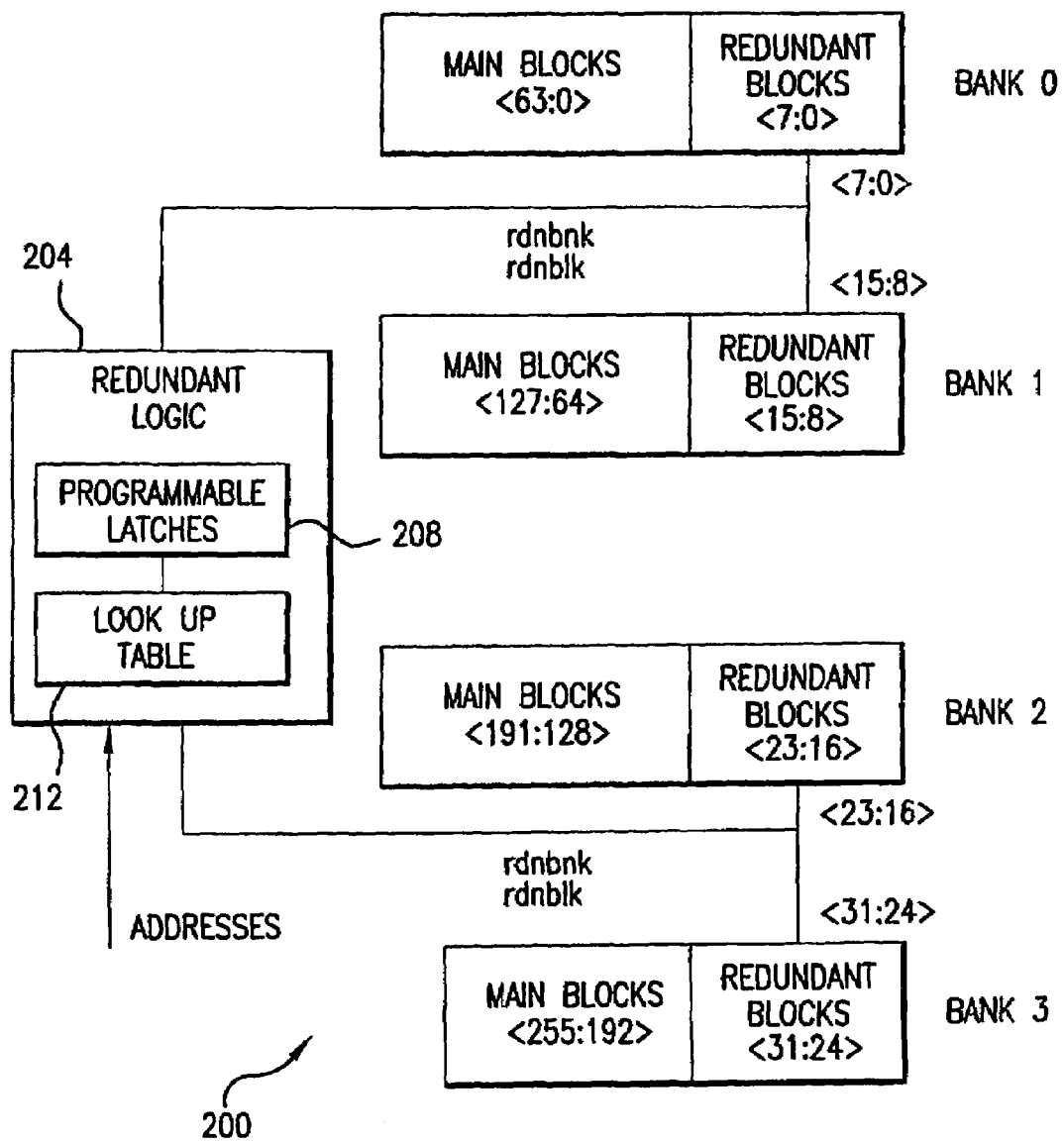
FIG. 2 is a block diagram of a first embodiment of the present invention.

FIG. 2 illustrates a first embodiment of the invention. FIG. 2 is identical to FIG. 1 except the redundant logic 104 of FIG. 1 is now replaced by redundant logic 204. Redundant logic 204 contains programmable latches 208 which interface with a lookup table to 212 which is programmed and stores a plurality of redundant block addresses which can be used by the redundant logic 204 to select a redundant memory block to substitute for a defective main memory block identified by an incoming address.

Figure 3:
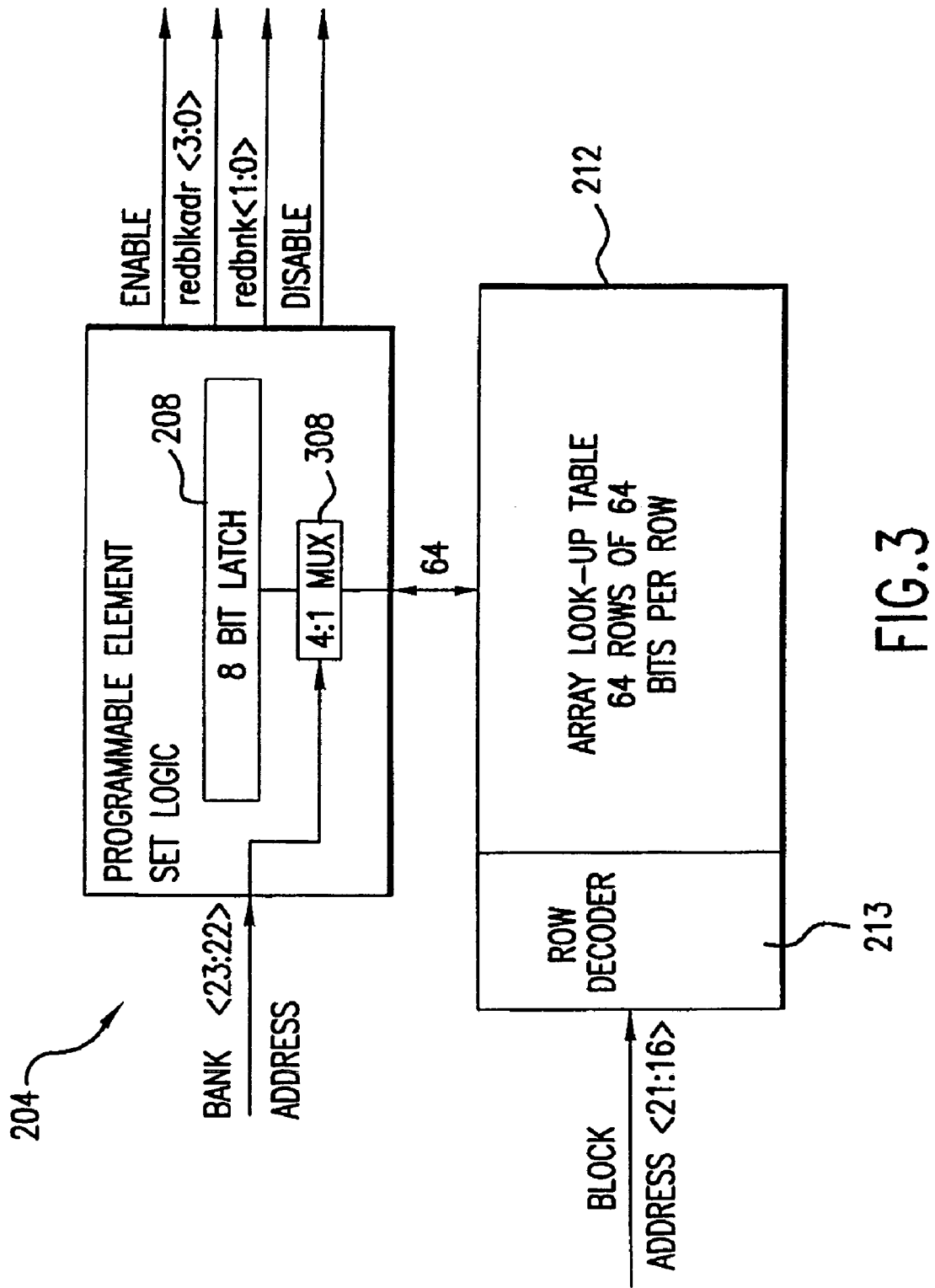
FIG. 3 is a block diagram showing further detail of the redundant logic shown in FIG. 2.

FIG. 3 shows the redundant logic 204 of FIG. 2 in greater detail. The latches 208 handle an 8-bit address and are connected to a 4:1 multiplexer 308 which supplies 1 of 4 portions of a 32 bit address taken from the column lines of a decoded row of lookup table 212. The lookup table 212 contains a plurality of rows of memory elements and each row contains memory elements storing 32 bits. For example, 64 rows may be provided in the lookup table 212 which are selected by a row decoder 13 in response to incoming block addresses <21:16>. The 4-1 multiplexer 308 is controlled to select one of the four sets of 8 bits contained in the 32 bits from the lookup table 212 in accordance with applied bank address signals <23:22>. By using the 4:1 multiplexer 308 along with the bank address signals <23:22>, addresses for 4 different memory banks can be held in each row of the lookup table 212 in four segments, each representing an address for a respective bank. Thus, the bank addresses <22: 23> select which bank is being accessed and cause the 8 bits in a row corresponding to the bank address to be applied by way of multiplexer 308 to the 8 bit latch 208. As noted, the block addresses <21:16> select a row through row decoder 213 with the selected memory bits of the row being presented to the multiplexer 308. The programmable elements loaded into latch 208 are thus determined by an incoming bank address <23: 22> and block address <21:16>.

FIG. 3 further illustrates the signals which emanate from the redundant logic 204. Included are enable and disable signals, described below, a read bank signal (redbnk<1:0>), and a read block address signal (redblkadr<3:0>). These signals are used to select one of the four banks and a block within one of the four selected banks for block substitution.

Figure 4:
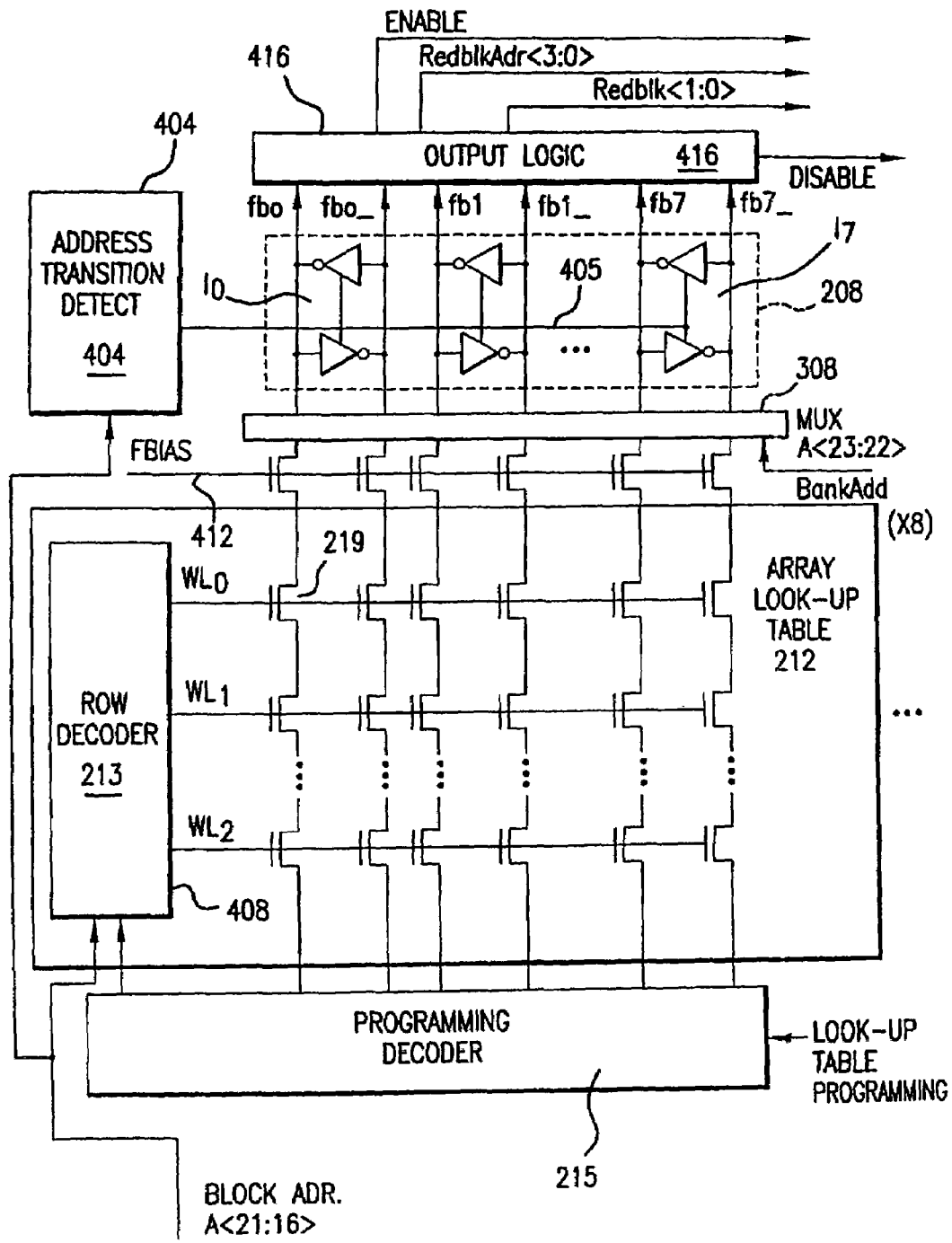
FIG. 4 is a schematic diagram showing further detail of the FIG. 3 lookup table and associated fuse set logic.

Additional details of the circuit depicted in FIG. 3 are shown in FIG. 4. The selected redundant memory bank and block are designated by the signals redblkadr<3:0> and redbnk<1:0> respectively, are provided by output logic 416. The row decoder 213 selects a row of the lookup table 212 in accordance with the applied block address signals A<21:16>. Each row of lookup table 212 contains 64 flash memory transistors 219 which can be pre-programmed row-by-row by programming decoder 215 with addresses of memory blocks which are to be substituted. Sixty-four transistors 219 are provided because the 32 bits stored in each row of the lookup table 212 are stored as the bits themselves and their complements; hence 64 transistors. In this embodiment 64 rows are used, so a total of 64 rows×4 memory blocks per row yields 256 possible block addresses which can be programmed into the lookup table 212. The row decoder 213 selects a new row of lookup table 212 in response to an incoming block address on the block address input <21:16>. The address transition detector 404 causes the programmable latches $l_{0-7}$ which form latch set 208 to load a new address from lookup table 212 into latches 208 in response to a signal from the address transition detector 404 on line 405. The detector 404 senses an incoming address transition and causes the loading of address information from the selected row line which has been enabled by row decoder 213. The multiplexer passes only a selected 8 bits of the 32 bits stored in a row under control of bank select signal A<23:22>. The F bias line acts to decouple the latches $l_{0-7}$ from the lookup table 212 when the transistors 219 of the lookup table are programmed.

The 8 bits of data stored for each block address contain 6 bits which are used for block selection, two of those bits being output in a bank select address (redbnk<1:0>), 4 being output as a block address (redblkadr<3:0>) and 2 bits designated as an enable bit and a disable bit. The output logic 416 sees the 8 bit address stored in latches $l_{0-7}$ and supplies the noted 8 bit output signals.

Figure 5:
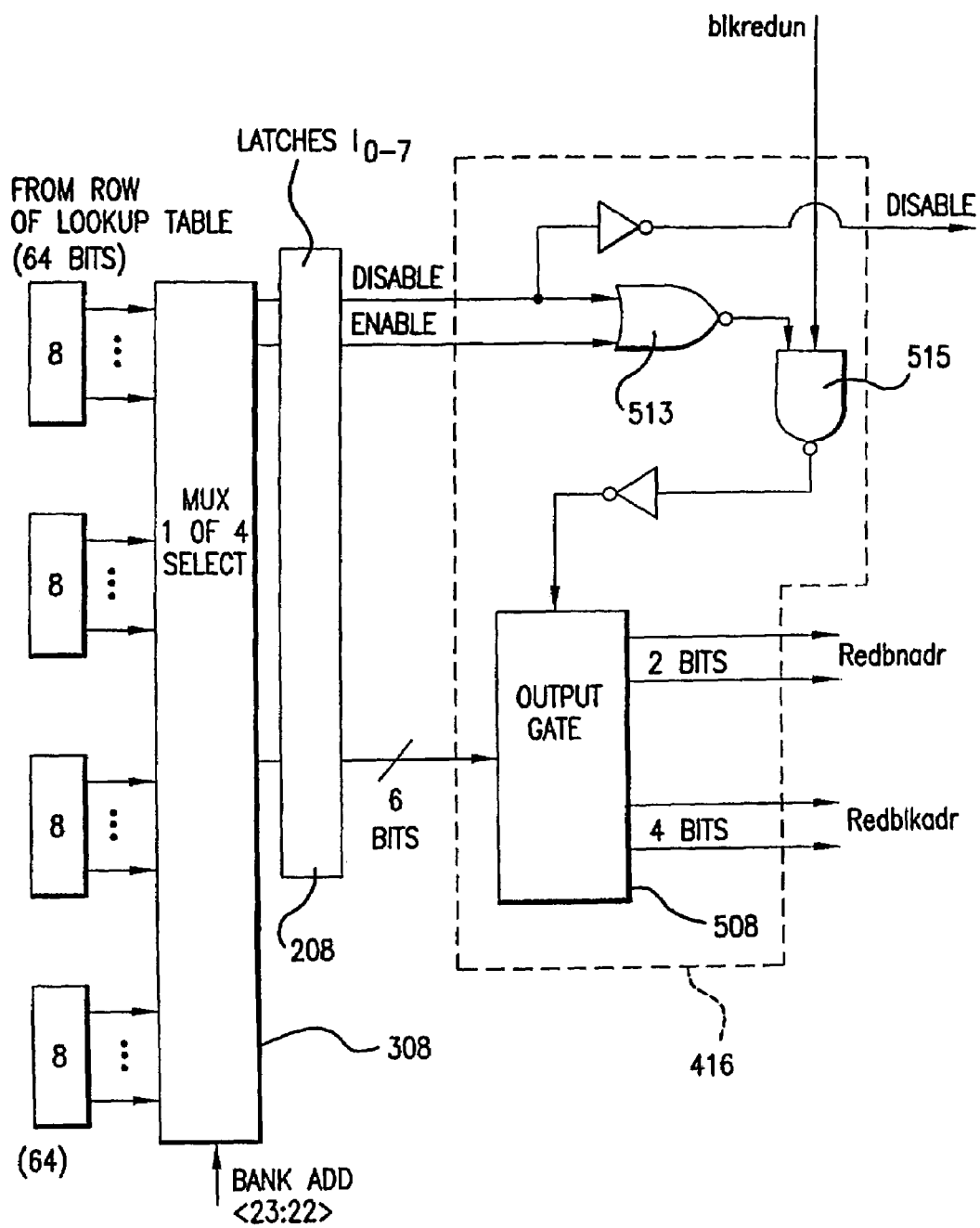
FIG. 5 is a schematic diagram showing further detail of the FIG. 3 fuse set logic output.

FIG. 5 shows an expanded view of the connections between the multiplexer 308 and the output logic 416. From FIG. 5 it can be seen that from the 8 bits generated by multiplexer 308, 2 bits eventually become the enable and disable bits, 4 bits are the redundant block address (redblkadr), and 2 bits are the redundant bank address (redbnkadr). The enable bit activates the output gates 508 through NOR gates 513 and NAND gate 515 when a block redundancy operation is selected by the signal blkredun. thereby making the latched addresses available to select a designated memory block of a selected memory bank. This bit can be programmed as desired so a selected bank and block address is used or not for block substitution. The disabled bit is used to disable the output from programmable latches and also may also be used to disable other operations of the memory device. It is possible a user would want to disable any redundant addressing when certain block addresses are selected. This could be useful if it were discovered that a replacement memory block was also defective.

Although each row of lookup table 212 is shown in FIG. 5 as having 8 selected bits by multiplexer 308, it is important to remember that each memory cell of a flash memory typically has 2 complementary bit lines which store the cell content. Accordingly, although FIG. 5 shows four 8-bit rows (32 bits total) loaded from the lookup table 212 to the 4:1 multiplexer 308, a 64 bit bus is necessary, as shown in FIG. 3.

Although the embodiment described above employs a lookup table which uses stored complementary bits which are output on respective complementary bit lines to load the latches, as an alternative embodiment each of the latches can also be individually loaded using a single stored bit loaded into the latch from an associated bit line of the look up table. This latter arrangement has the advantage of using fewer memory cells within, and out put bit lines from, the look up table to store and load the look up table information into the latches.

Referring back to FIG. 2, any of the redundant blocks <31:0>can be substituted for any of the main block <255: 00>because the substituted addresses stored in the lookup table for any presented bank and block address include a new bank and block address for a redundant block of memory.

Figure 6:
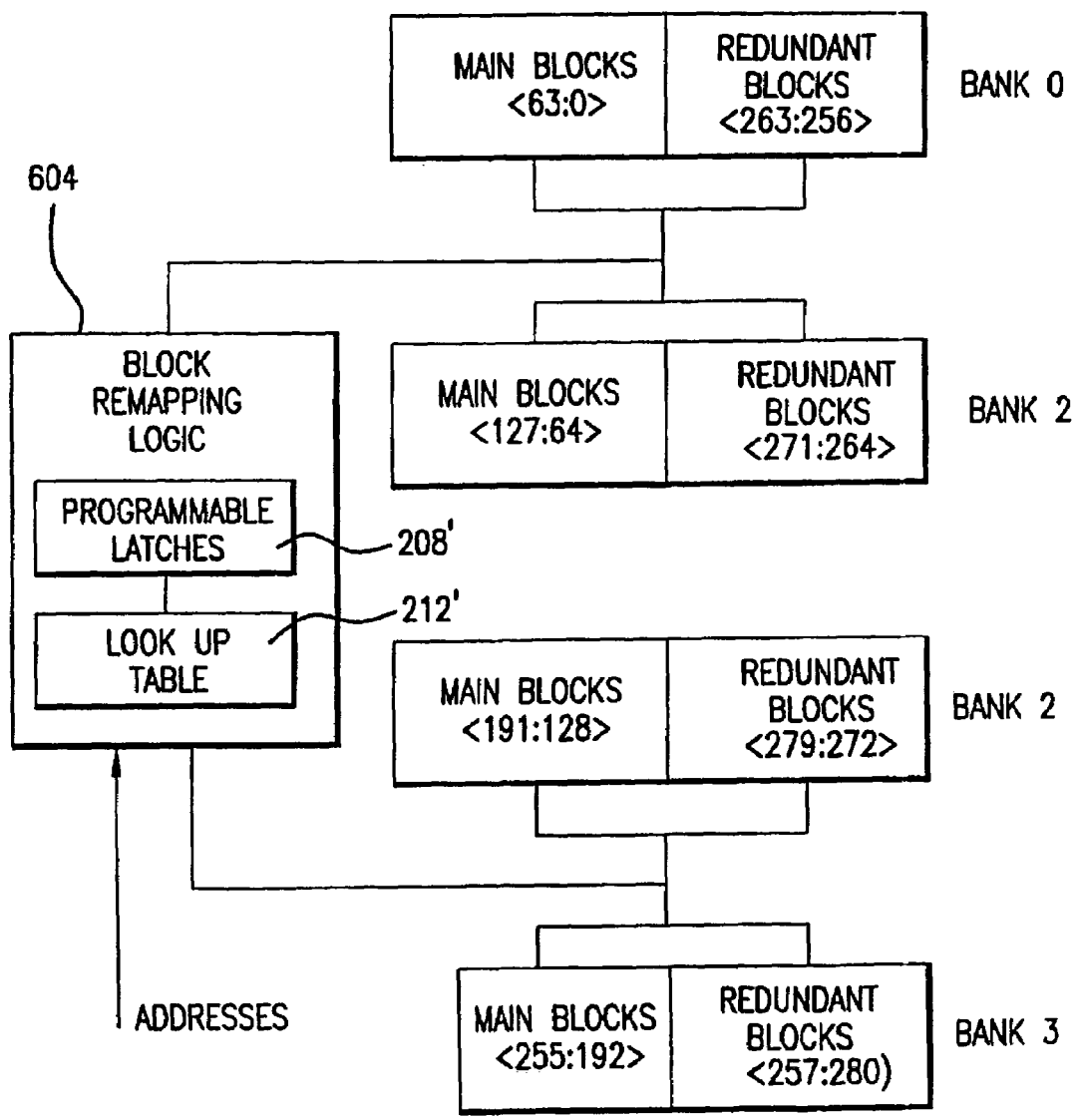
FIG. 6 is a block diagram of a second embodiment of the present invention.

In a second embodiment of the invention shown in FIG. 6, any memory block of a memory can be substituted for any other memory block including substituting a redundant block for a main block, a main block for a redundant block, a redundant block for a redundant block or a main block for a main block. The second embodiment accomplishes this by re-addressing all blocks so that each block has its own unique address as best can be illustrated by comparing the block diagram of FIG. 6 with that of FIG. 2. In FIG. 2 it was understood that there are 8 redundant blocks associated with every 64 main blocks, with the address of the redundant blocks being held on the rdnbnk and rdnblk address lines (FIGS. 3, 4, and 5). In FIG. 6, there are also 8 redundant blocks for every 64 main blocks but the redundant blocks are no longer addressed differently than the main blocks. Instead, all block addressing is done using the same address lines coming from block remapping logic 604. In this embodiment, each memory block whether main or redundant has its own unique address. Thus, for example, if memory block 62 is discovered to be bad or defective, block 271 can be substituted therefor, or perhaps block 191.

Figure 7:
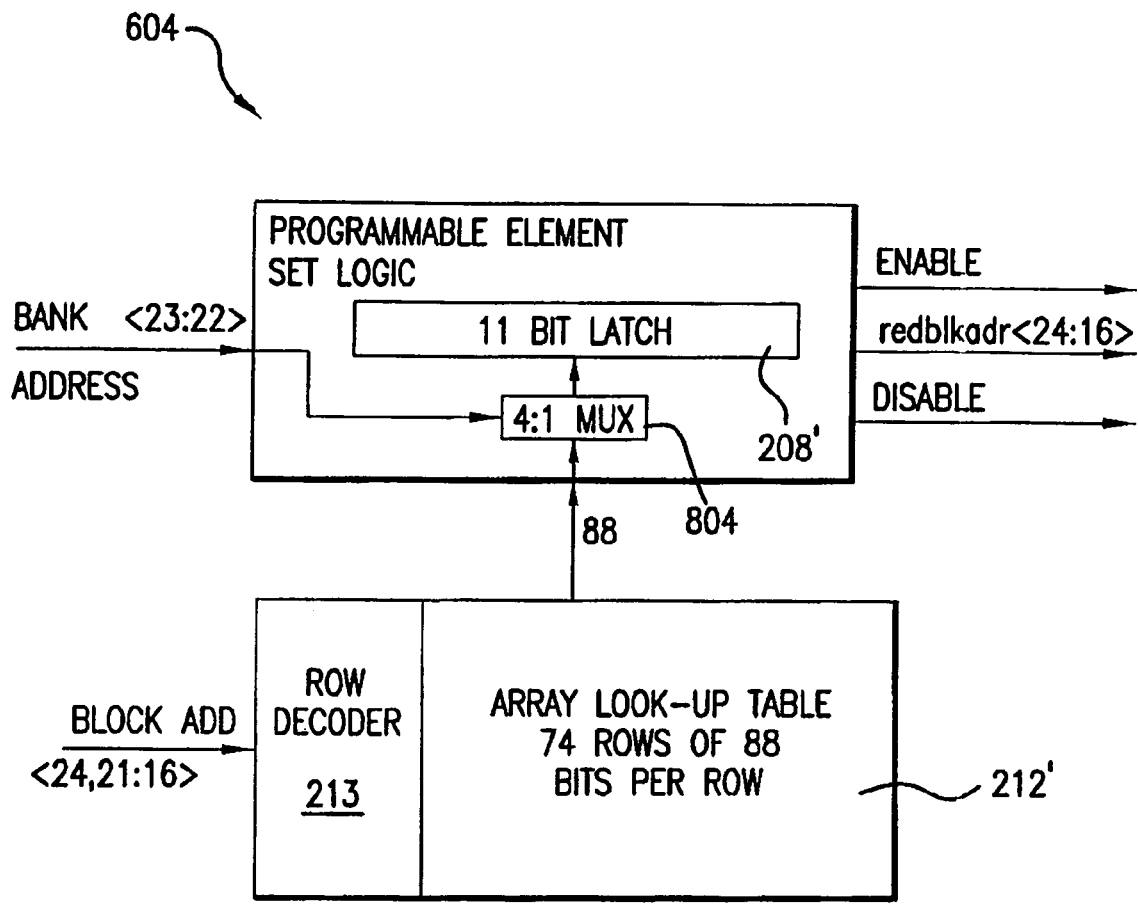
FIG. 7 is a block diagram showing further detail of the block re-mapping logic of FIG. 6.

As shown in FIG. 7, the second embodiment also differs from the first in that it has an 88 bit data path instead of 64 bits between the latches 208' and lookup table 212'. This is because the second embodiment addresses more memory blocks than the first. Thus, 9 bits are required for memory block addresses with 2 bits being used as the enable and disable bits. Accordingly, each stored block address within a row of the memory table is formed of 11 bits. As in the first embodiment, each row of the lookup table contains 4 block addresses so each row stores a total of 88 bits, 44 programming bits and their complements. The second embodiment also uses the bank address <23:22>to do the 4:1 multiplexing, but in the second embodiment block re-mapping logic 604 can address any block within the entire memory array. Thus, the output of the fuse set latches 208' are block addresses redblkadr<24:16>.

Figure 8:
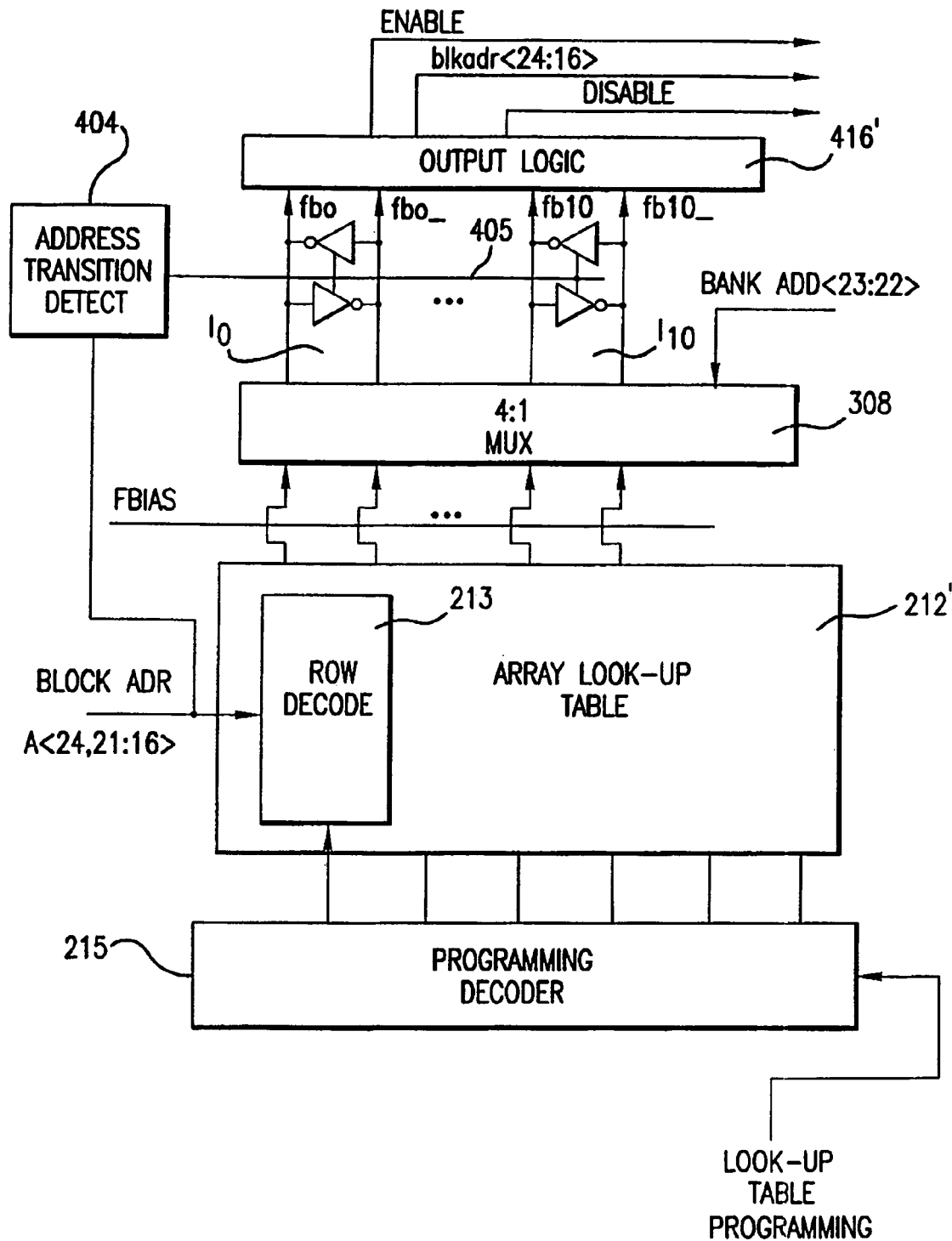
FIG. 8 is a schematic diagram showing further detail of the FIG. 7 lookup table and fuse set logic.
Figure 9:
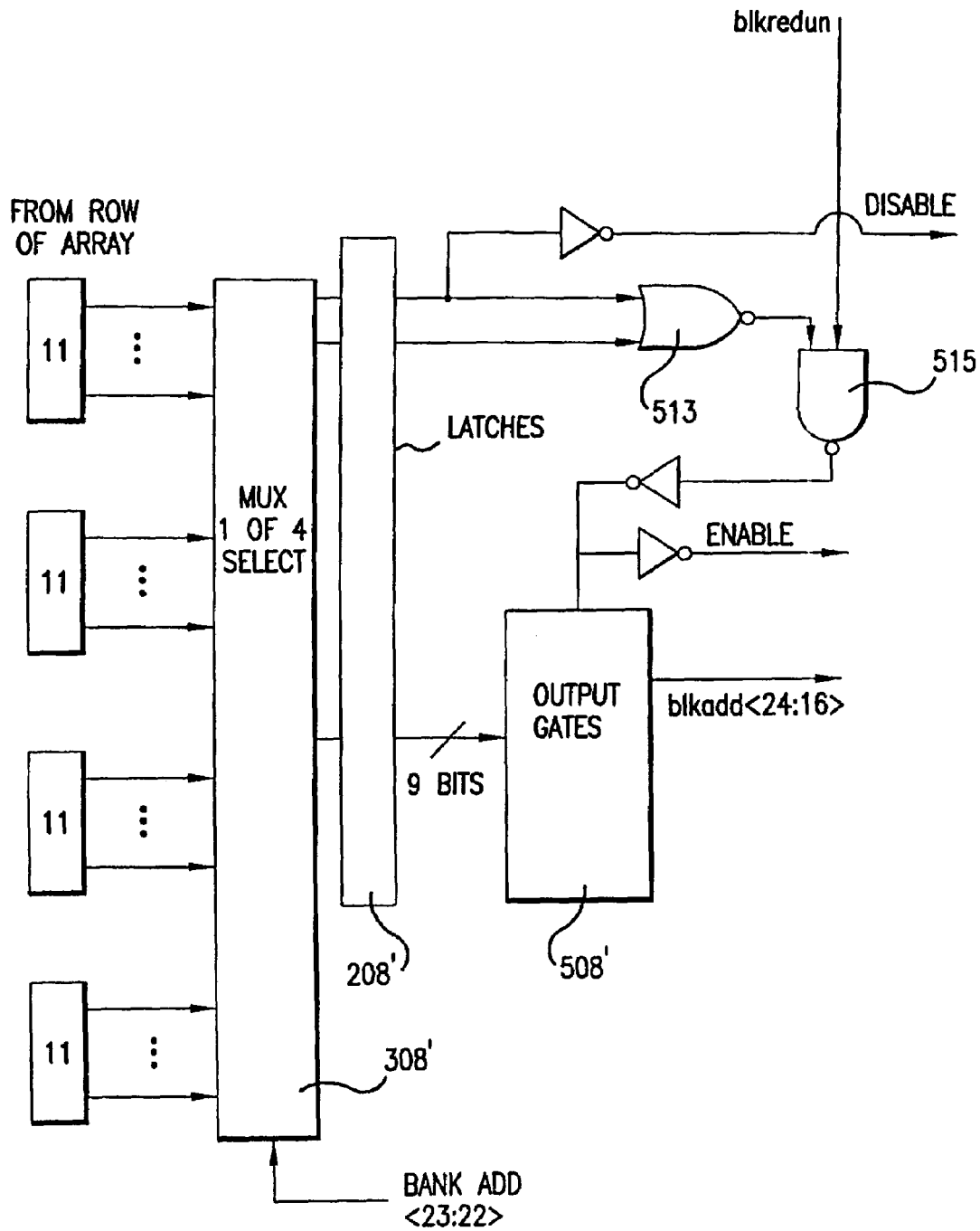
FIG. 9 is a block diagram showing further detail of the FIG. 7 fuse set logic output; and, FIG. 10 is a block diagram of a processor system utilizing a method and apparatus of the present invention.

The second embodiment of the invention also employs 2 bits as a disable and enable bit respectively. FIGS. 8 and 9 show the remapping logic 604 of the second embodiment in greater detail. FIG. 8 is similar to FIG. 4 of the first embodiment, but illustrates the output logic 416' as supplying the enable and disable bits as well as the block address blkadr <24:16> which is able to select any memory block of the memory array. Otherwise, FIG. 8 operates in the same manner of FIG. 4. FIG. 9 is similar to FIG. 5 and also shows output gates 508' supplying the block address signal blkadr <24:16>.

As with the first embodiment, the embodiment described above employs a lookup table which uses stored complementary bits which are output on respective complementary bit lines to load the latches, as an alternative embodiment each of the latches can also be individually loaded using a single stored bit loaded into the latch from an associated bit line of the look up table. This latter arrangement has the advantage of using fewer memory cells within, and out put bit lines from, the look up table to store and load the look up table information into the latches.

Figure 10:
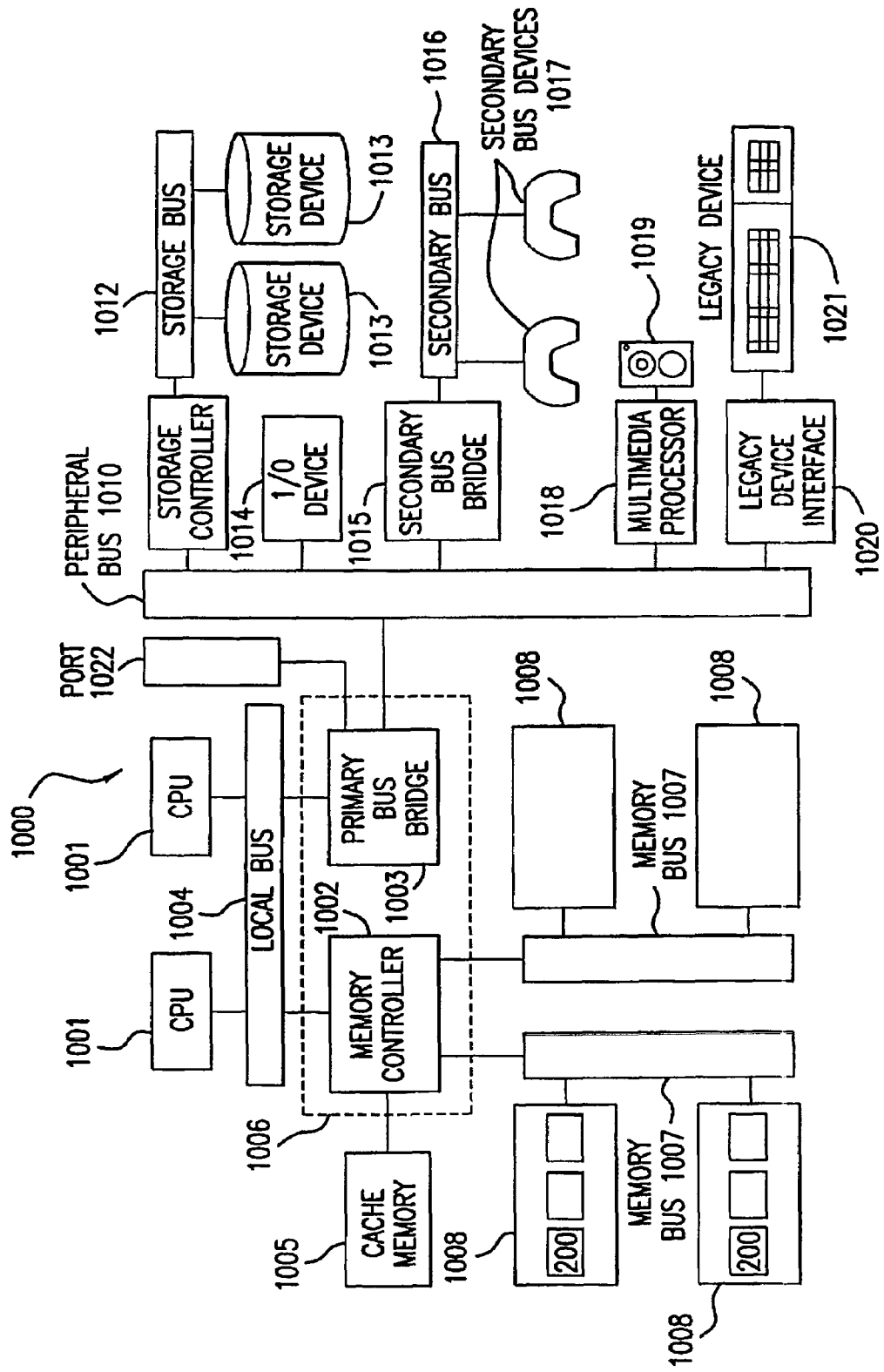

FIG. 10 illustrates an exemplary processing system 1000 which may utilize the memory device 200 of the present invention. The processing system 1000 includes one or more processors 1001 coupled to a local bus 1004. A memory controller 1002 and a primary bus bridge 1003 are also coupled the local bus 1004. The processing system 1000 may include multiple memory controllers 1002 and/or multiple primary bus bridges 1003. The memory controller 1002 and the primary bus bridge 1003 may be integrated as a single device 1006.

The memory controller 1002 is also coupled to one or more memory buses 1007. Each memory bus accepts memory components 1008 which include at least one memory device 200 of the present invention. The memory components 1008 may be a memory card or a memory module. The memory components 1008 may include one or more additional devices 1009. For example, the additional device 1009 might be used to configuration memory. The memory controller 1002 may also be coupled to a cache memory 1005. The cache memory 1005 may be the only cache memory in the processing system. Alternatively, other devices, for example, processors 1001 may also include cache memories, which may form a cache hierarchy with cache memory 1005. If the processing system 1000 include peripherals or controllers which are bus masters or which support direct memory access (DMA), the memory controller 1002 may implement a cache coherency protocol. If the memory controller 1002 is coupled to a plurality of memory buses 1007, each memory bus 1007 may be operated in parallel, or different address ranges may be mapped to different memory buses 1007.

The primary bus bridge 1003 is coupled to at least one peripheral bus 1010. Various devices, such as peripherals or additional bus bridges may be coupled to the peripheral bus 1010. These devices may include a storage controller 1011, an miscellaneous I/O device 1014, a secondary bus bridge 1015, a multimedia processor 1018, and an legacy device interface 1020. The primary bus bridge 1003 may also coupled to one or more special purpose high speed ports 1022. In a personal computer, for example, the special purpose port might be the Accelerated Graphics Port (AGP), used to couple a high performance video card to the processing system 1000.

The storage controller 1011 couples one or more storage devices 1013, via a storage bus 1012, to the peripheral bus 1010. For example, the storage controller 1011 may be a SCSI controller and storage devices 1013 may be SCSI discs. The I/O device 1014 may be any sort of peripheral. For example, the I/O device 1014 may be an local area network interface, such as an Ethernet card. The secondary bus bridge may be used to interface additional devices via another bus to the processing system. For example, the secondary bus bridge may be an universal serial port (USB) controller used to couple USB devices 1017 via to the processing system 1000. The multimedia processor 1018 may be a sound card, a video capture card, or any other type of media interface, which may also be coupled to one additional devices such as speakers 1019. The legacy device interface 1020 is used to couple legacy devices, for example, older styled keyboards and mice, to the processing system 1000.

The processing system 1000 illustrated in FIG. 10 is only an exemplary processing system with which the invention may be used. While FIG. 10 illustrates a processing architecture especially suitable for a general purpose computer, such as a personal computer or a workstation, it should be recognized that well known modifications can be made to configure the processing system 1000 to become more suitable for use in a variety of applications. For example, many electronic devices which require processing may be implemented using a simpler architecture which relies on a CPU 1001 coupled to memory components 1008 and/or memory devices 200. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

While the invention has been described and illustrated with reference to specific exemplary embodiments, it should be understood that many modifications and substitutions can be

What is claimed as new and desired to be protected by Letters Patent of the United States is:

1. A memory device, comprising:
    a block remapping circuit, having a look up table storing at least three addresses in each row of the look up table, which is capable of receiving a first address of a selected first memory block, capable of selecting a second address based on the first address from one of the at least three stored addresses to identify a second memory block, and capable of substituting the second memory block for the first memory block when the first memory block is defective,
    wherein the at least three stored addresses comprise the first address, the second address and a third address, which is an alternative address for the second address.

2. The memory device as in claim 1 wherein the lookup table comprises a plurality of memory elements arranged in rows and columns, and a row decoder for selecting a row of the lookup table based on at least a first portion of the first address, and a memory for receiving the second address from a selected row of the lookup table.

3. The memory device as in claim 2 wherein the first portion of the first address is a block address.

4. The memory device as in claim 2 further comprising a multiplexer for receiving at least a second portion of the first address for selecting memory elements in predetermined columns of the row to load into the memory.

5. The memory device as in claim 4 wherein the second portion of the first address is a bank address.

6. The memory device as in claim 2 further comprising an address transition detector for detecting an address transition in the first address for loading a new selected second address into the memory.

7. The memory device as in claim 6 wherein the address transition detector enables the memory upon detection of the address transition.

8. The memory device as in claim 2 wherein the second address has an associated enable bit which is located into the memory with the second address, the enable bit being used to determine if the second address is to be used for remapping.

9. The memory device as in claim 1 wherein the block remapping circuit substitutes a redundant memory block in a given memory bank for a defective memory block in the same bank.

10. The memory device as in claim 1 wherein the block remapping circuit substitutes a redundant memory block in a given memory bank for a defective memory block in a different memory bank.

11. A method of operating a memory device, the method comprising:
    receiving a first memory address identifying a first memory block for a memory operation;
    using the first address to select a second address from a lookup table for storing at least three addresses in each row of the lookup table, the second address being selected from one of the at least three stored addresses, the at least three addresses comprising the first address, second address and a third address being an alternate address for the second address; and
    loading the second address into a memory to select a second memory block to substitute for the first memory block when the first memory block is defective.

12. The method as in claim 11 wherein the using and selecting comprises decoding a portion of the first address to select a row of a plurality of rows of the lookup table and using a second portion of the first address to select column data from the selected row and loading the selected column data into the memory.

13. The method as in claim 12 wherein the first portion is a block address.

14. The method as in claim 13 wherein the second portion is a bank address.

15. The method of claim 11 further comprising detecting a transition in the first address to a new first address, using the new first address to select a new second address, and loading the new second address into the memory in response to the detection.

16. The method as in claim 11 wherein the second address has an associated enable bit, the method further comprises loading the associated enable bit into a memory and using the state of the enable bit to control the output of the second address from the memory.

17. The method as in claim 11 further comprising using the second address to substitute a redundant memory block for a defective memory block.

18. The method as in claim 11 further comprising using the second address to substitute a redundant memory block of a memory bank for a defective memory block of the same bank.

19. A processor system comprising:
    a processor; and
    a memory device coupled to supply data to the processor, the memory device comprising:
        a block remapping circuit having a lookup table for storing at least three addresses in each row of the lookup table and for selecting, based on a first address associated with a first memory block, a second address associated with a second memory block from one of the at least three stored addresses to identify the second memory block, the block remapping circuit being capable of substituting the second memory block for the first memory block when the first memory block is defective,
    wherein the at least three stored addresses comprise the first address, the second address and a third address, which is an alternative address for the second address.

20. The processor system as in claim 19, wherein the lookup table comprises a plurality of memory elements arranged in rows and columns, and a row decoder for selecting a row of the lookup table based on at least a first portion of the first address, a memory receiving the second address from a selected row of the lookup table.

21. The processor system as in claim 20 further comprising a multiplexer for receiving at least second portion of the first address for selecting memory elements in predetermined columns of the row to load into the memory.

22. The processor system as in claim 19 further comprising a programming circuit for programming the lookup table.

23. The processor system as in claim 22 further comprising a gating circuit for selectively uncoupling the lookup table from a memory during programming of the lookup table by the programming circuit.

24. The processor system as in claim 19 wherein the second address has an associated disable bit which is loaded into a memory with the second address, the disable bit being used to determine if remapping is to occur in the memory.

25. The processor system as in claim 19 wherein the block remapping circuit substitutes one redundant memory block for another redundant memory block.

26. The processor system as in claim 19 wherein the block remapping circuit substitutes a redundant memory block for a main memory block.

27. The processor system as in claim 19 wherein the block remapping circuit substitute one main memory block for another main memory block.

28. The processor system as in claim 19 wherein the block remapping circuit substitutes one main memory block for a redundant memory block.

29. A flash memory device comprising:
- a block remapping circuit for receiving a first address of a selected first flash memory block and for substituting a second address of a second flash memory block for the first flash memory block when the first flash memory block is defective,
- wherein the block remapping circuit comprises a look up table for storing at least three addresses in each row of the lookup table and for selecting based on the first address the second address from one of the at least three stored addresses to identify the second flash memory block, and
- the at least three stored addresses comprise the first address, the second address and a third address, which is an alternative address for the second address.

30. The flash memory device as in claim 29 further comprising a programming circuit for programming the lookup table.

31. The flash memory device as in claim 29 wherein the second address comprises at least a block address.

32. The flash memory device as in claim 31 wherein the second address further comprises a bank address.

33. The flash memory device as in claim 29 wherein the second address has an associated disable bit which is loaded into a flash memory with the second address, the disable bit being used to determine if remapping is to occur in the flash memory.

34. A memory device comprising:
- a block remapping circuit for receiving a first address of a selected first memory block and for substituting a second address of a second memory block for the first memory block when the first memory block is defective,
- wherein the block remapping circuit comprises a look up table having flash memory for storing at least three addresses in each row of the lookup table and for selecting based on the first address the second address from one of the at least three stored addresses to identify the second memory block, and
- the at least three stored addresses comprise the first address, the second address and a third address, which is an alternative address for the second address.

* * * * *